(12) United States Patent
Iou

(10) Patent No.: US 7,279,705 B2
(45) Date of Patent: Oct. 9, 2007

(54) ORGANIC LIGHT-EMITTING DEVICE

(75) Inventor: Chung-Yeh Iou, Wuci Township, Taichung County (TW)

(73) Assignee: AU Optronics Corp., Hsinchu (TW)

( * ) Notice: Subject to any disclaimer, the term of this patent is extended or adjusted under 35 U.S.C. 154(b) by 37 days.

(21) Appl. No.: 11/314,895

(22) Filed: Dec. 20, 2005

(65) Prior Publication Data

US 2006/0157728 A1 Jul. 20, 2006

(30) Foreign Application Priority Data

Apr. 4, 2005 (TW) .............................. 94110729 A

(51) Int. Cl.
*H01L 29/08* (2006.01)
(52) U.S. Cl. .......................... 257/40; 257/88
(58) Field of Classification Search ................ 257/40, 257/88, 89
See application file for complete search history.

(56) References Cited

U.S. PATENT DOCUMENTS 5,698,048 A * 12/1997 Friend et al. ............... 136/263
6,580,027 B2 * 6/2003 Forrest et al. .............. 136/263
6,972,431 B2 * 12/2005 Forrest et al. ................ 257/40
7,045,375 B1 * 5/2006 Wu et al. ..................... 438/35

FOREIGN PATENT DOCUMENTS

JP 2004327436 11/2004
TW 1230025 6/1993
WO WO 2005006817 1/2005

OTHER PUBLICATIONS

Taiwan Office Action mailed Jun. 12, 2006.

* cited by examiner

*Primary Examiner*—Roy Potter
(74) *Attorney, Agent, or Firm*—Thomas, Kayden, Horstemeyer & Risley

(57) ABSTRACT

An organic light-emitting device is provided, comprising a bottom electrode, at least two emissive units disposed on the bottom electrode, at least one charge-generation layer disposed between two adjacent emissive units, and a top electrode disposed on the emissive units. The charge-generation layer comprises fullerene or a derivative thereof, and generates and transports electrons and holes.

20 Claims, 2 Drawing Sheets

ORGANIC LIGHT-EMITTING DEVICE

BACKGROUND

The invention relates to a display device, and more particularly, to an organic light-emitting device.

Organic light-emitting diode (OLED) panels are currently popular in display technology. OLED, driven by electric current to luminesce actively and display images.

FIG. 1 is a cross-section of a conventional organic light-emitting panel 10, comprising a substrate 12 with an organic light-emitting device 20 disposed thereon. The organic light-emitting device 20 comprises a bottom electrode 14, an emissive unit 16, and a top electrode 18 respectively disposed on the substrate 12. The emissive unit 16 comprises a hole injection layer (HIL) 22, an emissive layer (EML) 24, and an electron injection layer (EIL) 26 respectively disposed on the bottom electrode 14.

Electrons and holes are respectively generated from the top electrode 18 and the bottom electrode 14 of the organic light-emitting device 20 upon application of voltage to the two electrodes. Electrons and holes from the two electrodes 18 and 14 penetrate the EIL 26 and the HIL 22, combining at the EML 24 to excite luminant material therein and luminesce.

However, the conventional organic light-emitting panel 10 illustrated in FIG. 1 is ineffective and has a short life, resulting in limited use for displays.

SUMMARY

An organic light-emitting device is provided, comprising a bottom electrode, at least two emissive units disposed on the bottom electrode, at least one charge-generation layer disposed between two nearby emissive units, and a top electrode disposed on the emissive units. The charge-generation layer comprises fullerene or a derivative thereof, and generates and transports electrons and holes.

DETAILED DESCRIPTION

Figure 1:
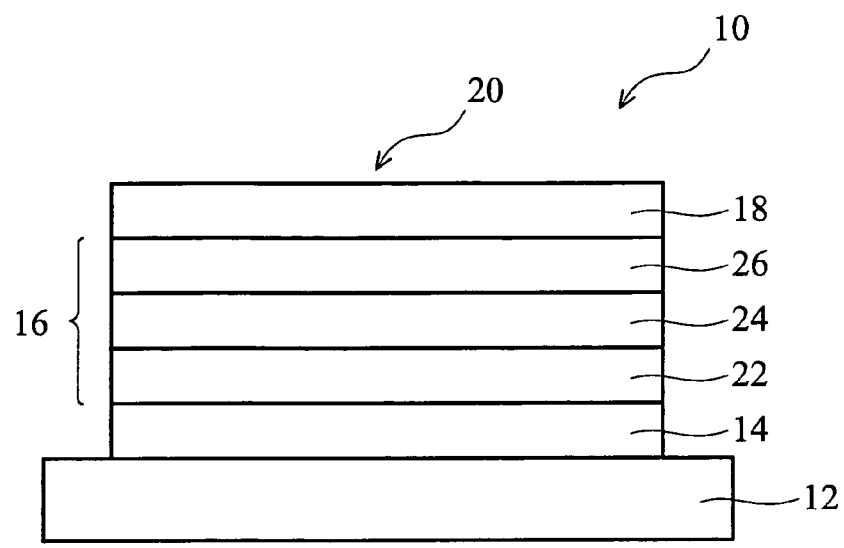
FIG. 1 is a cross-section of a conventional organic light-emitting diode panel.
Figure 2:
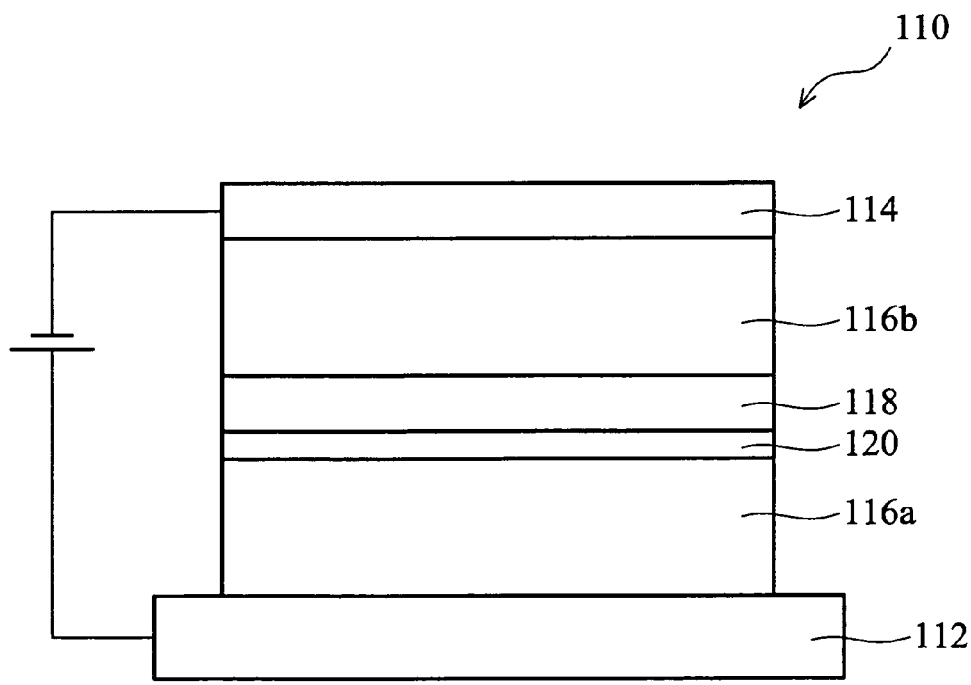
FIG. 2 is a cross-section of an organic light-emitting device according to embodiments of the invention.

FIG. 2 is a cross-section of an organic light-emitting device 110, comprising a bottom electrode 112 with emissive units 116a and 116b disposed thereon, a charge-generation layer 118 disposed between the emissive units 116a and 116b, and a top electrode 114 disposed on the two emissive units 116a and 116b. Moreover, a buffer layer 120 can be formed between the charge-generation layer 118 and the emissive unit (116a or 116b). The bottom electrode 112 and the top electrode 114 are respectively connected to a power source. The two emissive units 116a and 116b luminesce simultaneously to display images upon application of voltage to the bottom electrode 112 and the top electrode 114.

Figure 3:
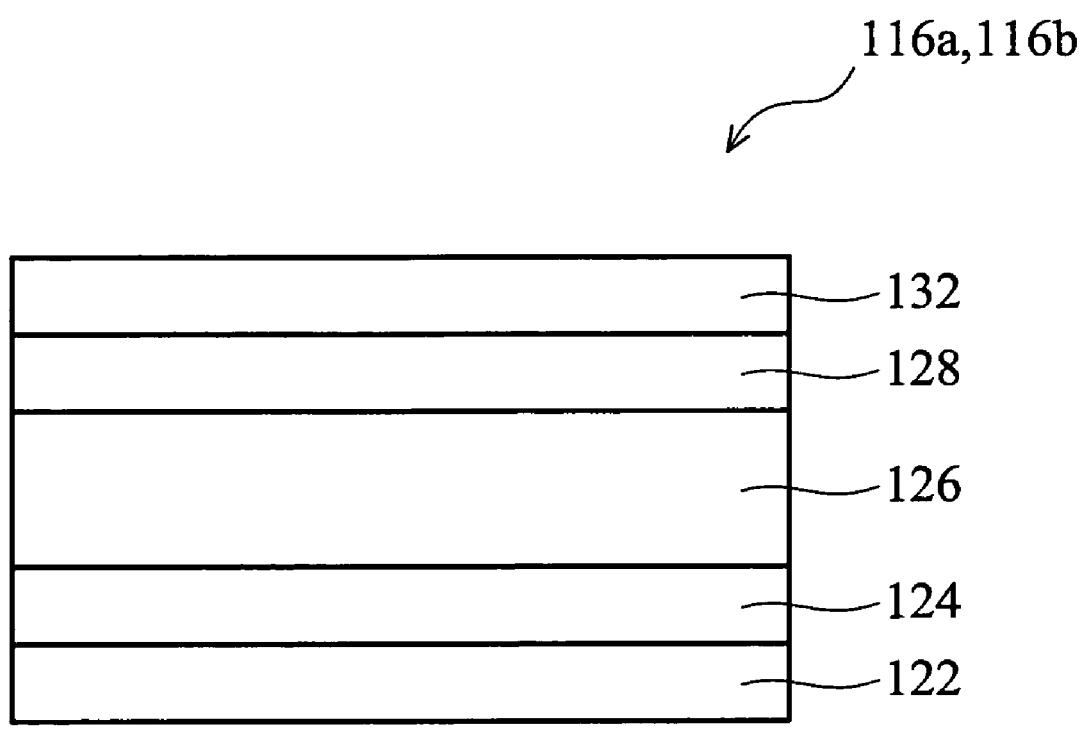
FIG. 3 is a cross-section of the emissive unit of the organic light-emitting device in FIG. 2.

FIG. 3 is a cross-section of the emissive unit (116a or 116b) of the organic light-emitting device 110 in FIG. 2. As shown in FIG. 3, the emissive unit (116a or 116b) comprises a hole injection layer (HIL) 122, a hole transport layer (HTL) 124, an emissive layer (EML) 126, an electron transport layer (ETL) 128, and an electron injection layer (EIL) 132, respectively disposed on the bottom electrode 112. In an embodiment of the invention, the hole injection layer 122 is doped with a p-type dopant, such as TF-TCNQ, $FeCl_3$ or combinations thereof. The concentration of the p-type dopant ranges from 0.1% to 50% by weight. The electron injection layer 132 is doped with a n-type dopant, such as metal halide, assisting the transportation of electrons/holes. The concentration of the n-type dopant ranges from 1% to 99% by weight.

Since the luminance of the light-emitting device depends on the series connection of emissive units (116a or 116b), ability of the charge-generation layer 118 to generate or transport electrons/holes is improved. The lowest unoccupied molecular orbit (LUMO) of the charge-generation layer 118 is between the highest occupied molecular orbit (HOMO) of the hole injection layer 122 and the LUMO of the electron injection layer 132, enabling smooth transport of electrons/holes from one emissive unit (116a or 116b) to another. The charge-generation layers 118 can be formed by thermal evaporation to prevent adjacent emissive units (116a or 116b) from damage during manufacture.

The charge-generation layer 118 comprises fullerene or a derivative thereof, such as C60, C70, and C90, or, alternatively oligofluorenes, terfluorene, ter(9,9-diaryfluorene)s, oligo(9,9-diaryfluorene)s, or a derivative thereof. The thickness of the charge-generation layer 118 is about 0.1-100 nm.

A buffer layer 120 is formed between the charge-generation layer 118 and the emissive unit 116a. Materials of the buffer layer 120 are the same as the charge-generation layer 118 for reasons described. The work function of the buffer layer 120 is preferably between the LUMO of the charge-generation layer 118 and the LUMO of the electron injection layer 132, for enhanced electron injection. The buffer layer 120 comprises Al, Ag, Ni, Ti, Ca, Mg, Rb, Ta, or a combination thereof.

It is noteworthy that while the organic light-emitting device 110 can comprise, two emissive units 116a and 116b, a plurality of emissive units can further be used, and charge-generation layers 118 can also be formed between these emissive units for enhanced transportation and generation of electrons/holes.

The emissive units (116a or 116b) in the organic light-emitting device 110 can be the same or different depending on application. For example, the luminant color of all emissive units (116a or 116b) in one organic light-emitting device 110 can be the same, or, alternatively the luminant color of at least one emissive unit (116a or 116b) can be different.

The organic light-emitting device 110 according to the invention can be a top-side luminant organic light-emitting device, a bottom-side luminant organic light-emitting device, or two-sided luminant organic light-emitting device. The luminant color from the organic light-emitting device can be red light, green light, blue light, or white light.

In the first embodiment of the invention, an anode, such as Indium Tin Oxide (ITO), is treated by ultraviolet rays and ozone, then respectively deposited with an HIL at a thickness of 60 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. An aluminum layer at a thickness of 2 nm for buffer layer and a C60 layer at a thickness of 5 nm for charge-generation layer are then respectively deposited on the first emissive unit by evaporation. A NPB layer at a thickness of 60 nm for HIL, NPB layer at a thickness of 20 nm for HTL, green EML at a thickness of 60 nm, and ETL at a thickness of 20 nm are then respectively formed on the charge-generation layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

In the second embodiment of the invention, an anode, such as Indium Tin Oxide (ITO), is treated by ultraviolet rays and ozone, and respectively depositing with an HIL at a thickness of 60 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. An aluminum layer at a thickness of 2 nm for buffer layer and a C60 layer at a thickness of 5 nm for charge-generation layer are then respectively deposited on the first emissive unit by evaporation. A layer of aromatic amine derivative or a combination thereof at a thickness of 60 nm for HIL, NPB layer at a thickness of 20 nm for HTL, green EML at a thickness of 60 nm, and ETL at a thickness of 20 nm are then respectively formed on the charge-generation layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

In the third embodiment of the invention, an anode, such as Indium Tin Oxide (ITO), is treated by ultraviolet rays and ozone, and respectively depositing with an HIL at a thickness of 60 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. An aluminum layer at a thickness of 2 nm for buffer layer is then deposited on the first emissive unit by evaporation. A NPB layer at a thickness of 60 nm for HIL, NPB layer at a thickness of 20 nm for HTL, green EML at a thickness of 60 nm, and ETL at a thickness of 20 nm are then respectively formed on the buffer layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

In the fourth embodiment of the invention, an anode, such as Indium Tin Oxide (ITO), is treated by ultraviolet rays and ozone, and respectively depositing with an HIL at a thickness of 60 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. An aluminum layer at a thickness of 2 nm for buffer layer is then deposited on the first emissive unit by evaporation. A layer of aromatic amine derivative or a combination thereof at a thickness of 60 nm for HIL, NPB layer at a thickness of 20 nm for HTL, green EML at a thickness of 60 nm, and ETL at a thickness of 20 nm are then respectively formed on the buffer layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

In the fifth embodiment of the invention, an anode, such as Indium Tin Oxide (ITO), is treated by ultraviolet rays and ozone, and respectively depositing with an HIL at a thickness of 150 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. A C60 layer at a thickness of 10 nm for charge-generation layer is deposited on the first emissive unit by evaporation. A layer of aromatic amine derivative or a combination thereof at a thickness of 30 nm for HIL, NPB layer at a thickness of 20 nm for HTL, yellow EML at a thickness of 35 nm, and ETL at a thickness of 20 nm are then respectively formed on the charge-generation layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

In the sixth embodiment of the invention, an anode, such as Indium Tin Oxide (ITO), is treated by ultraviolet rays and ozone, and respectively depositing with an HIL at a thickness of 150 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. An aluminum layer at a thickness of 2 nm for buffer layer, C60 layer at a thickness of 10 nm for charge-generation layer are then respectively deposited on the first emissive unit by evaporation. A layer of aromatic amine derivative or a combination thereof at a thickness of 60 nm for HIL, NPB layer at a thickness of 20 nm for HTL, yellow EML at a thickness of 35 nm, and ETL at a thickness of 30 nm are then respectively formed on the charge-generation layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

In the seventh embodiment of the invention, an anode, such as Indium Tin Oxide (ITO), is treated by ultraviolet rays and ozone, and respectively depositing with an HIL at a thickness of 150 nm, HTL at a thickness of 20 nm, green EML at a thickness of 60 nm, ETL at a thickness of 10 nm, and Alq layer at a thickness of 20 nm on the anode, forming the first emissive unit by evaporation. The HIL can be of aromatic amine derivative or a combination thereof, the HTL can be of NPB, and the Alq layer can be doped with a 20 weight% n-type dopant, such as CsF. An aluminum layer at a thickness of 2 nm for buffer layer, C60 layer at a thickness of 10 nm for charge-generation layer are then respectively deposited on the first emissive unit by evaporation. A layer of aromatic amine derivative or a combination thereof at a thickness of 30 nm for HIL, NPB layer at a thickness of 20 nm for HTL, yellow EML at a thickness of 35 nm, and ETL at a thickness of 30 nm are then respectively formed on the charge-generation layer, forming the second emissive unit. The NPB layer for HIL can be doped with a 2 weight% p-type dopant, such as F4-TCNQ. A LiF layer at a thickness of 1 nm and an aluminum layer at a thickness of 100 nm are then respectively formed on the second emissive unit for cathode.

According to experimental results, the luminous efficiency of the conventional green organic light-emitting device is about 9-10 cd/A upon reaching saturated current density. In the first two embodiments disclosed, luminous efficiency can reach 21 and 20 cd/A. In the third and the fourth embodiments disclosed, luminous efficiency can reach 18 and 17 cd/A.

Moreover, luminous efficiency of conventional yellow and blue organic light-emitting devices are about 4 cd/A upon reaching saturated current density. However, in the fifth, sixth, and seventh embodiments, luminous efficiency can reach 8, 7, and 7 cd/A respectively. The organic light-emitting devices according to the invention provide higher luminous efficiency and brighter display, improving the display quality of the panel.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An organic light-emitting device, comprising:
   a bottom electrode;
   at least two emissive units disposed on the bottom electrode;
   at least one charge-generation layer comprising fullerene or a derivative thereof, disposed between the at least two emissive units, for generating electrons and holes; and
   a top electrode disposed over the emissive units.

2. The organic light-emitting device of claim 1, wherein the at least one charge-generation layer comprises oligofluorenes or a derivative thereof.

3. The organic light-emitting device of claim 1, wherein the at least one charge-generation layer comprises terfluorene, (ter(9,9-d diaryfluorene)s), (oligo(9,9-diaryfluorene)s), or a derivative thereof.

4. The organic light-emitting device of claim 1, wherein the at least one charge-generation layer comprises C60, C70, C90, or a derivative thereof.

5. The organic light-emitting device of claim 1, wherein each of the at least two emissive units comprises a hole injection layer, an electron injection layer disposed on the hole injection layer, and an emissive layer disposed between the hole injection layer and the electron injection layer.

6. The organic light-emitting device of claim 5, wherein each of the at least two emissive units further comprises a hole transport layer disposed between the hole injection layer and the emissive layer, and an electron transport layer disposed between the emissive layer and the electron injection layer.

7. The organic light-emitting device of claim 5, wherein the at least one charge-generation layer has a Lowest Unoccupied Molecular Orbital (LUMO) between a Highest Occupied Molecular Orbital (HOMO) of the hole injection layer and a LUMO of the electron injection layer.

8. The organic light-emitting device of claim 5, further comprising a buffer layer disposed between the at least one charge-generation layer and the electron injection layer.

9. The organic light-emitting device of claim 8, wherein the buffer layer has a work function between the LUMO of the at least one charge-generation layer and the LUMO of the electron injection layer.

10. The organic light-emitting device of claim 8, wherein the buffer layer comprises Al, Ag, Ni, Ti, Ca, Mg, Rb, Ta, or combinations thereof.

11. The organic light-emitting device of claim 5, wherein the electron injection layer is doped with an n-type dopant.

12. The organic light-emitting device of claim 11, wherein the n-type dopant comprises metal halide.

13. The organic light-emitting device of claim 11, wherein the n-type dopant has a concentration ranging from about 1% to about 99% by weight.

14. The organic light-emitting device of claim 5, wherein the hole injection layer comprises a p-type dopant.

15. The organic light-emitting device of claim 14, wherein the p-type dopant comprises TF-TCNQ, FeCl3, or a combination thereof.

16. The organic light-emitting device of claim 14, wherein the p-type dopant has a concentration ranging from about 0.1% to about 50% by weight.

17. The organic light-emitting device of claim 1, wherein the at least one charge-generation layer has a thickness ranging from about 0.1 to about 100 nm.

18. The organic light-emitting device of claim 1, wherein the at least two emissive units have the same luminant color.

19. The organic light-emitting device of claim 1, wherein the at least two emissive units have different luminant colors.

20. The organic light-emitting device of claim 1, wherein at least one of the bottom electrode and the top electrode comprises a transparent electrode.

* * * * *